(12) United States Patent
Omura et al.

(10) Patent No.: US 10,168,007 B2
(45) Date of Patent: Jan. 1, 2019

(54) LIGHT-EMITTING DEVICE AND ILLUMINATING APPARATUS

(71) Applicant: PANASONIC INTELLECTUAL PROPERTY MANAGEMENT CO., LTD., Osaka (JP)

(72) Inventors: Koji Omura, Osaka (JP); Ayako Tsukitani, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 66 days.

(21) Appl. No.: 15/384,857

(22) Filed: Dec. 20, 2016

(65) Prior Publication Data

US 2017/0175957 A1 Jun. 22, 2017

(30) Foreign Application Priority Data

Dec. 21, 2015 (JP) .................... 2015-249057

(51) Int. Cl.
*F21K 9/64* (2016.01)
*F21V 7/04* (2006.01)
(Continued)

(52) U.S. Cl.
CPC ............... *F21K 9/64* (2016.08); *F21V 7/041* (2013.01); *F21V 9/30* (2018.02); *F21V 19/003* (2013.01); *F21V 23/002* (2013.01); *H01L 25/0753* (2013.01); *F21Y 2113/13* (2016.08); *F21Y 2113/17* (2016.08); *F21Y 2115/10* (2016.08); *H01L 33/502* (2013.01); *H01L 33/504* (2013.01); *H01L 2224/48137* (2013.01); *H01L 2924/181* (2013.01)

(58) Field of Classification Search
None
See application file for complete search history.

(56) References Cited

U.S. PATENT DOCUMENTS 5,998,925 A * 12/1999 Shimizu ............ C09K 11/7767
257/103
7,095,056 B2 * 8/2006 Vitta .................. F21K 9/00
257/88

(Continued)

FOREIGN PATENT DOCUMENTS

JP 2011-146640 7/2011

OTHER PUBLICATIONS

Li, "The CRI-CAM02UCS Colour Rendering Index", Color research and application, vol. 37, No. 3, Jun. 2012, pp. 160-167.

*Primary Examiner* — Britt D Hanley
(74) *Attorney, Agent, or Firm* — Greenblum & Bernstein, P.L.C.

(57) ABSTRACT

A light-emitting device includes blue LED chips having a light emission peak wavelength of at least 430 nm and at most 470 nm and red LED chips having a light emission peak wavelength of at least 600 nm and at most 640 nm. The light-emitting device includes a yellow phosphor having a light emission peak wavelength of at least 500 nm and at most 580 nm and a red phosphor having a light emission peak wavelength of at least 640 nm and at most 670 nm. The light-emitting device emits white light through mixing of light emitted by each of the blue LED chips, the red LED chips, the yellow phosphor, and the red phosphor.

17 Claims, 9 Drawing Sheets

(51) Int. Cl.

| | |
|---|---|
| *F21V 9/30* | (2018.01) |
| *F21V 19/00* | (2006.01) |
| *F21V 23/00* | (2015.01) |
| *H01L 33/50* | (2010.01) |
| *F21Y 113/13* | (2016.01) |
| *F21Y 113/17* | (2016.01) |
| *F21Y 115/10* | (2016.01) |
| *H01L 25/075* | (2006.01) |

(56) References Cited

U.S. PATENT DOCUMENTS

2013/0002157 A1\* 1/2013 van de Ven ........ H05B 33/0824
　　　　　　　　　　　　　　　　　　315/192
2013/0147348 A1\* 6/2013 Motoya ................ F21V 3/061
　　　　　　　　　　　　　　　　　　313/512
2015/0204493 A1\* 7/2015 Omura .................... F21S 8/026
　　　　　　　　　　　　　　　　　　362/84
2015/0334789 A1\* 11/2015 van de Ven ............ H05B 33/02
　　　　　　　　　　　　　　　　　　313/498

\* cited by examiner

LIGHT-EMITTING DEVICE AND ILLUMINATING APPARATUS

CROSS REFERENCE TO RELATED APPLICATION

This application claims the benefit of priority of Japanese Patent Application Number 2015-249057 filed on Dec. 21, 2015; the entire content of which is hereby incorporated by reference.

BACKGROUND

1. Technical Field

The present disclosure relates to a light-emitting device and an illuminating apparatus using the light-emitting device.

2. Description of the Related Art

Semiconductor light-emitting elements such as light-emitting diodes (LEDs) are widely used as efficient and space-saving light sources in various illuminating apparatuses for use in illumination, displays, etc.

Furthermore, chip-on-board (COB) LEDs in which LEDs are mounted on a board and sealed using a light-transmissive resin are well known (see, for example, Japanese Unexamined Patent Application Publication No. 2011-146640 (Patent Literature 1).

SUMMARY

White light emitted by a light-emitting device using a light-emitting element such as an LED has a biased light emission spectrum, and thus has lower color reproducibility than natural light. In other words, in the light-emitting device, improving color reproducibility is problematic.

The present disclosure provides a light-emitting device and an illuminating apparatus that are capable of improving red color reproducibility.

A light-emitting device according to an aspect of the present disclosure includes: a first light-emitting element having a light emission peak wavelength of at least 430 nm and at most 470 nm; a second light-emitting element having a light emission peak wavelength of at least 600 nm and at most 640 nm; a first phosphor which, when excited by light emitted by the first light-emitting element, emits light having a light emission peak wavelength of at least 500 nm and at most 580 nm; and a second phosphor which, when excited by light emitted by the first light-emitting element, emits light having a light emission peak wavelength of at least 640 nm and at most 670 nm, wherein the light-emitting device emits white light through mixing of light emitted by each of the first light-emitting element, the second light-emitting element, the first phosphor, and the second phosphor.

An illuminating apparatus according to an aspect of the present disclosure includes the above-described light-emitting device; and a lighting device which supplies the light-emitting device with power for causing the light-emitting device to light up.

A light-emitting device and an illuminating apparatus according to an aspect of the present disclosure are capable of improving red color reproducibility.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, a light-emitting device, etc., according to Embodiment 1 will be described with reference to the Drawings. It should be noted that each of the exemplary embodiments described below represent a generic or specific example. The numerical values, shapes, materials, structural components, the arrangement and connection of the structural components, steps, the processing order of the steps, etc. shown in the following exemplary embodiments are mere examples, and are not intended to limit the scope of the present disclosure. Furthermore, among the structural components in the following; exemplary embodiments, components not recited in any one of the independent claims which indicate the broadest concepts are described as arbitrary structural components.

It should be noted that the respective figures are schematic diagrams and are not necessarily precise illustrations. Furthermore, in the respective figures, substantially identical components are assigned the same reference signs, and overlapping description may be omitted or simplified.

Furthermore, in the following; exemplary embodiments, the Z-axis direction is, for example, the vertical direction, and there are instances where the Z-axis positive side is referred to as the top side (upside). Furthermore, there are instances where the Z-axis negative side is referred to as bottom side (downside). Furthermore, the X-axis direction and the Y-axis direction are mutually orthogonal directions in a plane (horizontal plane) perpendicular to the Z-axis.

Embodiment 1

[Configuration of Light-Emitting Device]

Figure 1:
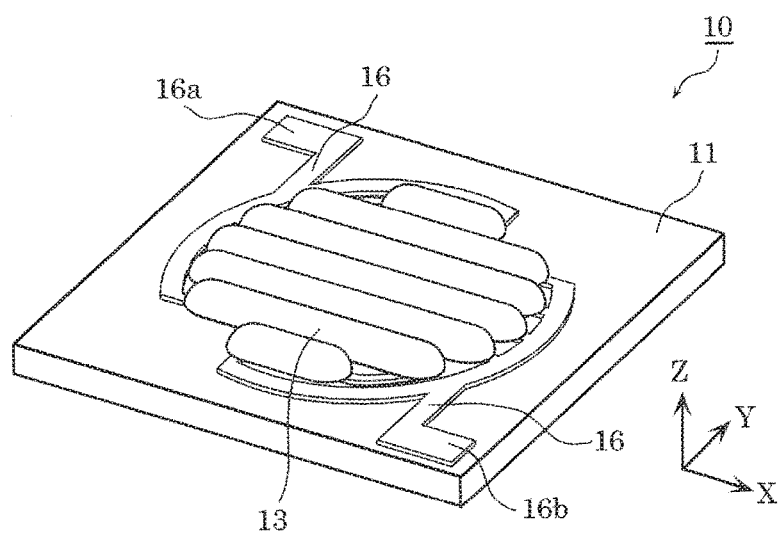
FIG. 1 is an external perspective view of a light-emitting device according to Embodiment 1.
Figure 2:
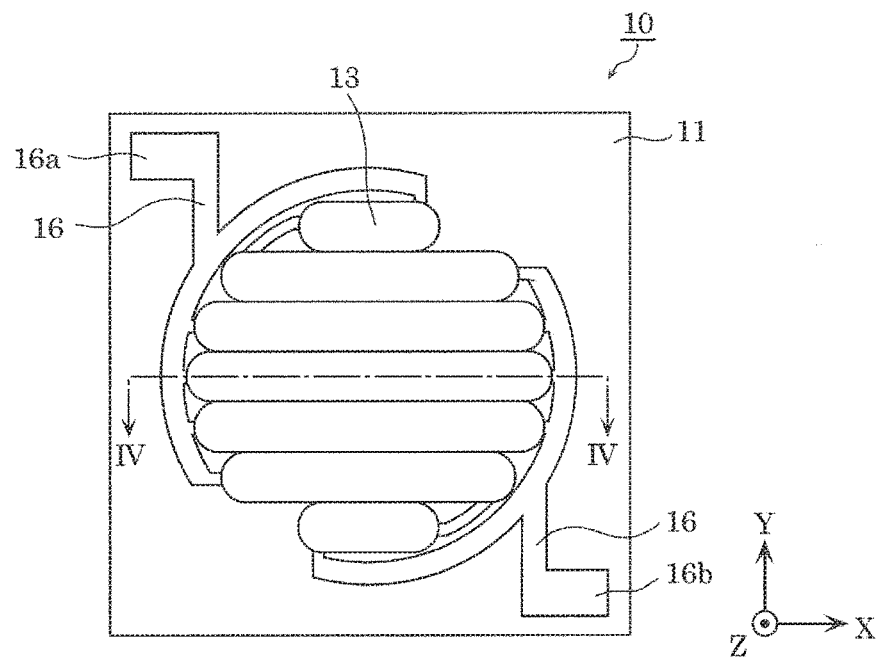
FIG. 2 is a plan view of the light-emitting device according to Embodiment 1.
Figure 3:
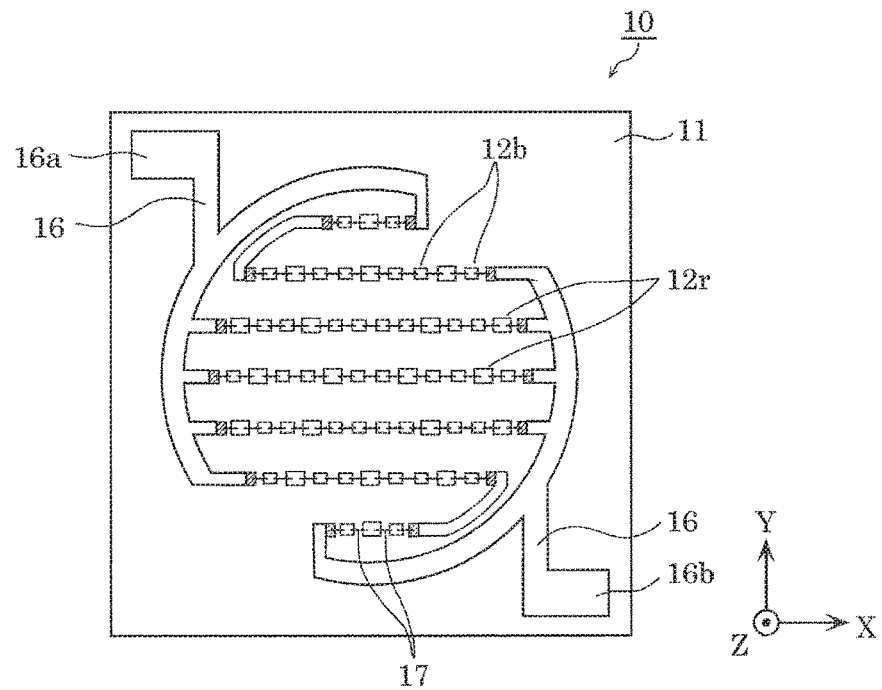
FIG. 3 is a plan view illustrating the internal structure of the light-emitting device according to Embodiment 1.
Figure 4:
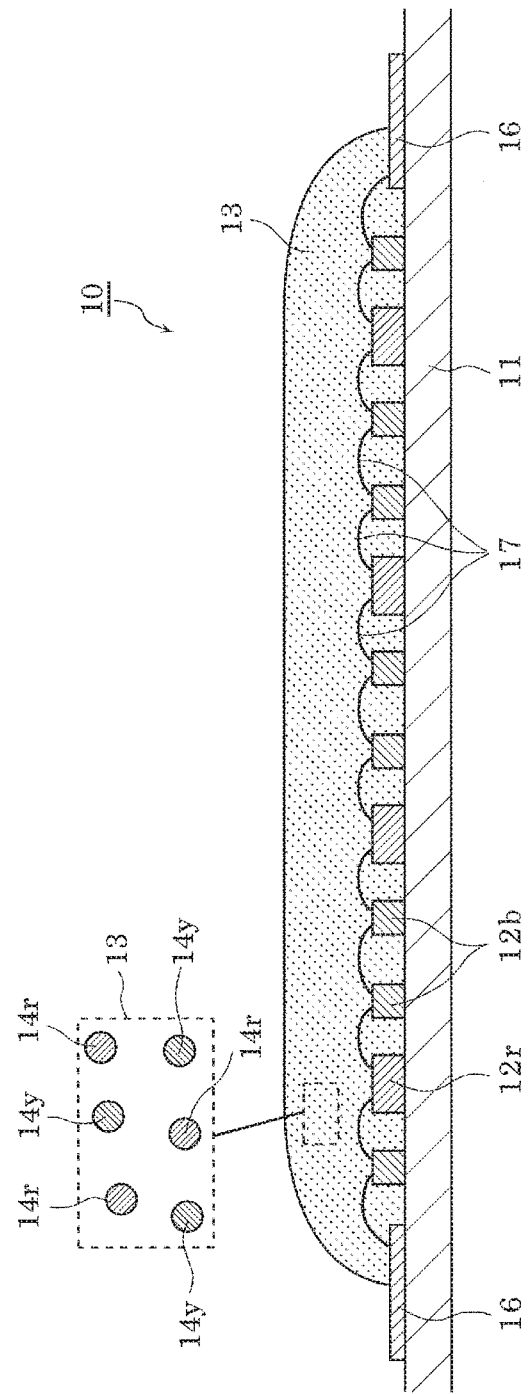
FIG. 4 is a schematic cross-sectional view of the light-emitting device along line IV-IV in FIG. 2.

First, the configuration of a light-emitting device according to Embodiment 1 will be described using the drawings. FIG. 1 is an external perspective view of the illuminating apparatus according to Embodiment 1. FIG. 2 is a plan view of the light-emitting device according to Embodiment 1. FIG. 3 is a plan view illustrating the internal structure of the light-emitting device according to Embodiment 1. FIG. 4 is a schematic cross-sectional view along line IV-IV in FIG. 2. It should be noted that FIG. 3 is a plan view in which sealer 13 is removed to show the internal structure such as the LED chip arrangement and wiring pattern.

As illustrated in FIG. 1 to FIG. 4, light-emitting device 10 according to Embodiment 1 includes board 11, blue LED chips 12b, red LED chips 12r, and sealer 13. Hereinafter, there are instances where "LED chip" is used as a generic name for blue LED chips 12b and red LED chips 12r.

Light-emitting device 10 is an LED module having a COB structure in which blue LED chips 12b and red LED chips 12r are directly mounted onto board 11.

Board 11 is a board (e.g., substrate) having a wiring region in which wiring 16 for supplying power to blue LED chips 12b and red LED chips 12r is provided. Wiring 16 (as well as electrode 16a and electrode 16b) is formed using metal. Board 11 is, for example, a metal base board or a ceramic board. Furthermore, board 11 is may be a resin board having resin as a base material.

As a ceramic board, an alumina board comprising aluminum oxide (alumina) or an aluminum nitride board comprising aluminum nitride, etc. is used. Furthermore, as a metal base board, for example, an aluminum alloy board, a ferroalloy board, or a copper alloy board, etc., on the surface of which an insulating film is formed is used. As a resin board, for example, a glass-epoxy board comprising glass fiber and epoxy resin, etc. is used.

It should be noted that, as board 11, a board having high optical reflectance (for example, an optical reflectance of at least 90%) may be used. By using a board having high optical reflectance for board 11, the light emitted by blue LED chips 12b and red LED chips 12r can be reflected off the surface of board 11. As a result, the light-extraction efficiency of light-emitting device 10 is improved. Such a board is exemplified by a white ceramic board having, for example, alumina as a base material.

Furthermore, as board 11, a light-transmissive board that is highly transmissive of light may be used. Such a board is exemplified by a light-transmissive ceramic board comprising polycrystalline alumina or aluminum nitride, a transparent glass board comprising glass, a crystal board comprising crystal, a sapphire board comprising sapphire, or a transparent resin board comprising a transparent resin material.

It should be noted that although board 11 is rectangular in Embodiment 1, board 11 may be of a different shape such as circular.

Blue LED chips 12b are examples of a first light-emitting element, and are LED chips that emit blue light. Blue LED chips 12b are formed using, for example, an InGaN-based material. The light emission peak wavelength of blue LED chips 12b is, for example, at least 430 nm and at most 470 nm.

Red LED chips 12r are examples of a second light-emitting element, and are LED chips that emit red light. Red LED chips 12r are formed using, for example, an AlGaInP-based material. The light emission peak wavelength of red LED chips 12r is, for example, at least 600 nm and at most 640 nm.

A plurality of light-emitting element arrays each including a plurality of LED chips are provided on board 11. As illustrated in FIG. 3, structurally, seven light-emitting element arrays arranged along the X-axis direction are provided on board 11.

Electrically, five light-emitting element arrays each including 12 LED chips connected in series are provided on board 11. The five light-emitting element arrays are connected in parallel, and emit light when power is supplied between electrode 16a and electrode 16b.

Furthermore, one light-emitting element array out of the five light-emitting element arrays includes at least one each of blue LED chips 12b and red LED chips 12r. In other words, in one light-emitting element array, at least one blue LED chip 12b and red LED chip 12r are connected in series. In addition, one light-emitting element array includes the same number of blue LED chips 12b and the same number of red LED chips 12r as the other light-emitting element arrays. Accordingly, the total Vf of the LED chips in each of the light-emitting element arrays can be made uniform.

In the example in FIG. 3, the number of blue LED chips 12b in one light-emitting element array is eight, and the number of red LED chips 12r in one light-emitting element array is four. In other words, the number of blue LED chips 12b included in one light-emitting element array is double the number of red LED chips 12r included in the one light-emitting element array.

Furthermore, red LED chips 12r are dispersed so that one red LED chip 12r is not adjacent with another red LED chip 12r in both the X-axis direction and Y-direction. Accordingly, light-emitting device 10 is capable of emitting white light with uniform redness.

Furthermore, LED chips that are connected in series are mainly chip-to-chip connected by bonding wire 17 (part of LED chips 12 are connected by wire 16). Bonding wire 17 is a power supplying line that is connected to the LED chips. It should be noted that gold (Au), silver (Ag), or copper (Cu), for example, is used as the metal material for bonding wire 17 as well as aforementioned wire 16, electrode 16a, and electrode 16b. It should be noted that although details are not illustrated in the figures, wire 16 is covered by a resist film.

Sealer 13 contains yellow phosphor 14y and red phosphor 14r (illustrated in FIG. 4), and is a sealing component that seals the plurality of LED chips. More specifically, sealer 13 seals each of the seven light-emitting element arrays arranged along the X-axis direction, in the shape of a line following the light-emitting element array. Specifically, blue LED chips 12b and red LED chips 12r are collectively sealed by a light-transmissive resin (sealer 13) containing yellow phosphor 14y and red phosphor 14r. It should be noted that bonding wire 17 and part of wire 16 is sealed by sealer 13.

Although a methyl-based silicone resin, for example, is used as the light-transmissive resin that becomes the base material of sealer 13, an epoxy resin or a urea resin, etc., may be used.

Yellow phosphor 14y is an example of a first phosphor, and emits light when excited by the light emitted by blue LED chips 12b. Yellow phosphor 14y is, for example, an yttrium aluminum garnet (YAG)-based phosphor having a light emission peak wavelength of at least 550 nm and at most 570 nm.

Sealer 13 may contain a green phosphor in place of yellow phosphor 14y or in addition to yellow phosphor 14y. The green phosphor is, for example, a $Y_3(Al, Ga)_5O_{12}:Ce^{3+}$ phosphor or a $Lu_3Al_5O_{12}:Ce^{3+}$ phosphor which has a light emission peak wavelength of at least 515 nm and at most 550 nm.

Furthermore, other phosphors may be used as the first phosphor. As the first phosphor, it is sufficient that a phosphor having a light emission peak wavelength of at least 500 nm and at most 580 nm is used.

Red phosphor 14r is an example of a second phosphor, and emits light when excited by the light emitted by blue LED chips 12b. Red phosphor 14r is, for example, a. $CaAlSiN_3:Eu^{2+}$ phosphor which has a light emission peak wavelength of at least 640 nm and at most 670 nm, but may be a $(Sr, Ca) AlSiN_3:Eu^{2+}$ phosphor, etc.

In this manner, although red phosphor 14r comprising a nitride is given. as an example of the second phosphor, other phosphors may be used as the second phosphor. As the second phosphor, it is sufficient that a phosphor having a light emission peak wavelength of at least 640 nm and at most 670 nm is used.

In light-emitting device 10, part of the blue light emitted by blue LED chips 12b is wavelength-converted into yellow light by yellow phosphor 14y contained in sealer 13. Furthermore, part of the blue light emitted by blue LED chips 12b is wavelength-converted in to red light by red phosphor 14r contained in sealer 13. Then, light-emitting device 10 emits white light through the mixing of the blue light that is not absorbed by yellow phosphor 14y and red phosphor 14r, the yellow light from the wavelength-conversion by red phosphor 14y, and the red light from the wavelength-conversion by red phosphor 14r.

In this manner, sealer 13 functions as a wavelength converter by containing yellow phosphor 14y and red phosphor 14r. Furthermore, sealer 13 also has a function of protecting blue LED chips 12b and red LED chips 12r.

[Light Emission Spectrum]

Figure 5:
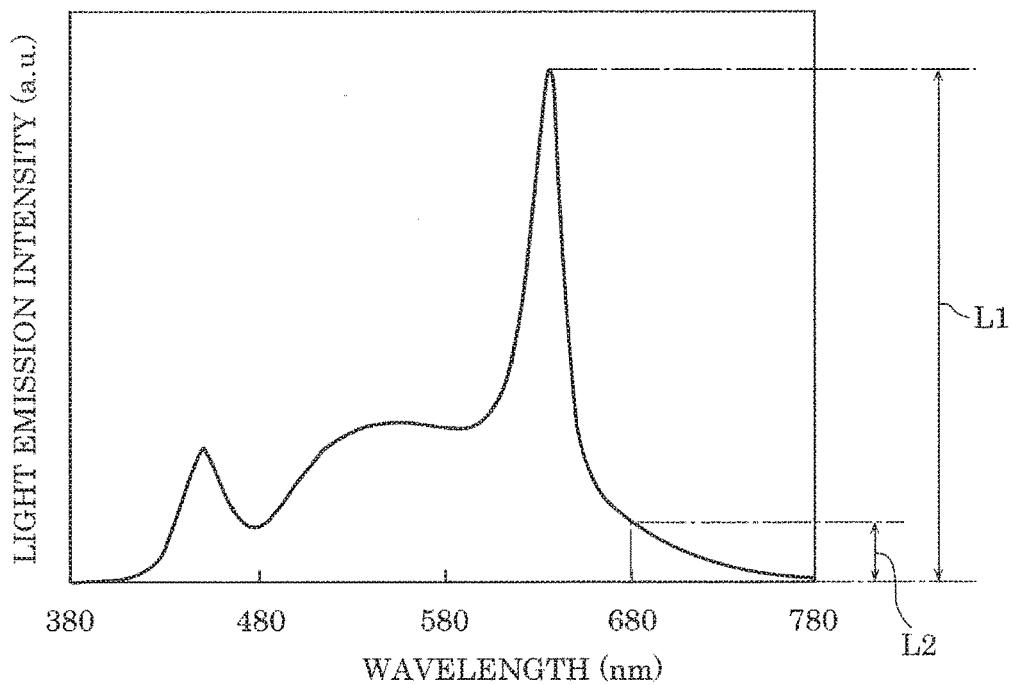
FIG. 5 is a graph illustrating the light-emitting spectrum of the light-emitting device according to Embodiment 1.
Figure 6:
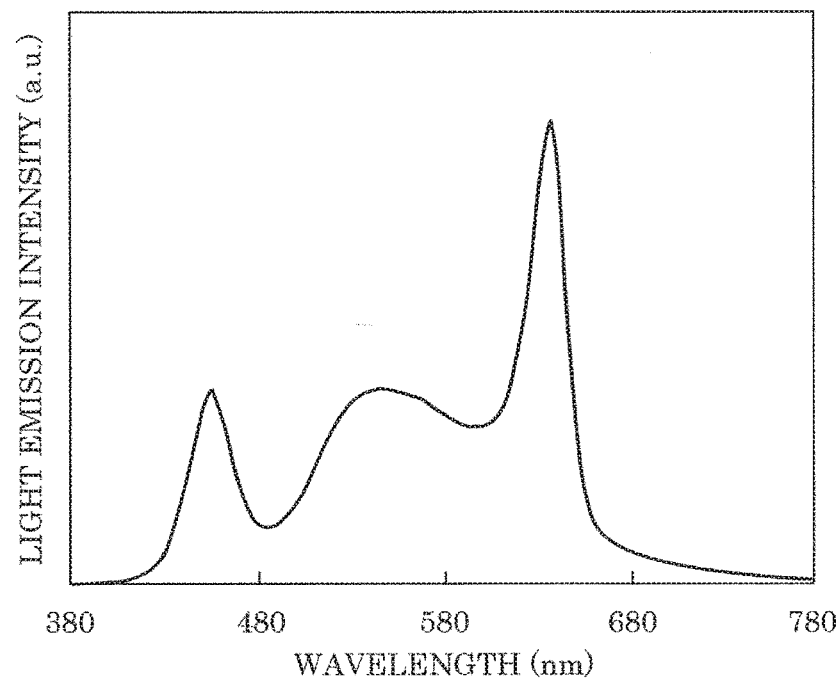
FIG. 6 is a graph illustrating the light-emitting spectrum of a light-emitting device according to a comparative example.

Light-emitting device 10 is characterized by including both red LED chips 12r and red phosphor 14r in order to enhance red color reproducibility. Hereinafter, the light emission spectrum of the white light emitted by such light-emitting device 10 will be described with reference to a comparative example. FIG. 5 is a graph illustrating the light emission spectrum of light-emitting device 10. FIG. 6 is a graph strafing the light-emitting spectrum of a light-emitting device according to a comparative example.

It should be noted that FIG. 5 illustrates, as an example, the light emission spectrum in the case where sealer 13 contains red phosphor 14r having a light emission peak located in the vicinity of 650 nm. Furthermore, the light-emitting device according to the comparative example is different from light-emitting device 10 in that sealer 13 does not contain red phosphor 14r, and is identical to light-emitting device 10 in terms of other elements.

Comparing FIG. 5 and FIG. 6, the light emission spectrum of the white light emitted by light-emitting device 10 has more red components (at least 580 nm components) because sealer 13 contains red phosphor 14r. With this, light-emitting device 10 can improve red color reproducibility. Specifically, with the white light emitted by light-emitting device 10, special color rendering index R9 is improved, and thus the appearance of red meat (for example, beef) improves.

Figure 7:
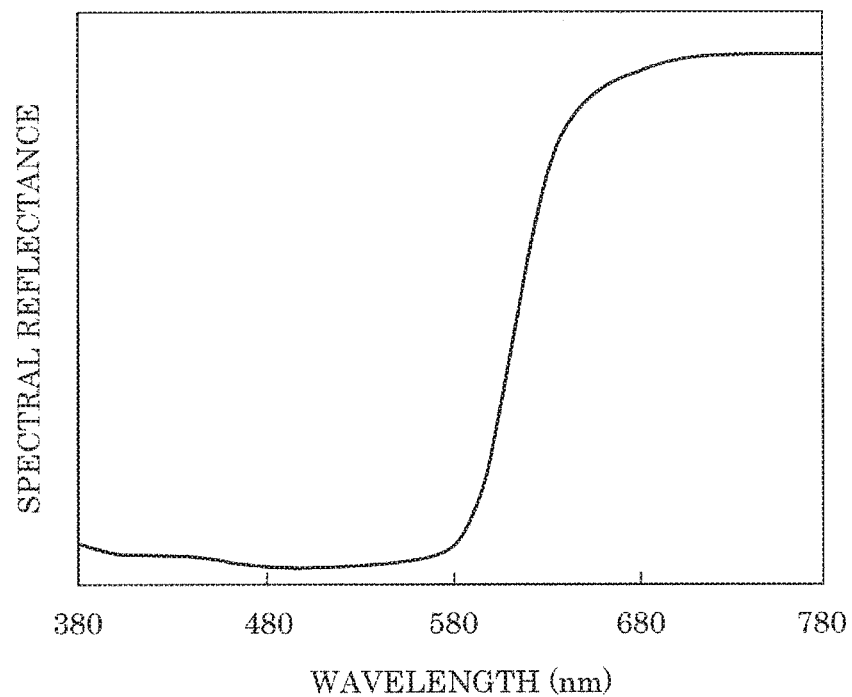
FIG. 7 is a graph illustrating a spectral reflectance (reflection spectrum) of a color sample of special color rendering index R9.

The special color rendering indices including special color rendering index R9 are calculated using the color difference obtained by illuminating a color sample using a sample light source in this case, light-emitting device 10). FIG. 7 is a graph illustrating a spectral reflectance (reflection spectrum) of a color sample of special color rendering index R9.

As illustrated in FIG. 7, the sample color of color sample of special color rendering index R9 mainly reflects light in the range of 580 nm and higher.

Here, light-emitting device 10 includes red LED chips 12r having a light emission peak wavelength of at least 600 nm and at most 640 nm, and red phosphor 14r having a light emission peak wavelength of at least 640 nm and at most 670 nm. As such, the white light emitted by light-emitting device 10 has enhanced light intensity over a broad range within the range of 580 nm and higher. Therefore, with the white light emitted by light-emitting device 10, special color rendering index R9 is improved. In other words, light-emitting device 10 is capable of improving red color reproducibility.

It should be noted that, as in the light-emitting device according to the comparative example, in a light-emitting device including only red LED chips 12r out of red LED chips 12r and red phosphor 14r, the redness of the white light can only be adjusted through the number of red LED chips or the light emission intensity of red LED chips 12r. When red LED chips 12r and blue LED chips 12b are connected in series as described above, redness is generally adjusted through the number of red LED chips 12r because it is difficult to selectively adjust only the light emission intensity of red LED chips 12r. However, in this case, fine adjust t of redness is difficult.

In contrast, in light-emitting device 10, fine adjustment of the redness of the white light is facilitated by adjusting the amount of red phosphor 14r that is added to sealer 13.

Figure 8:
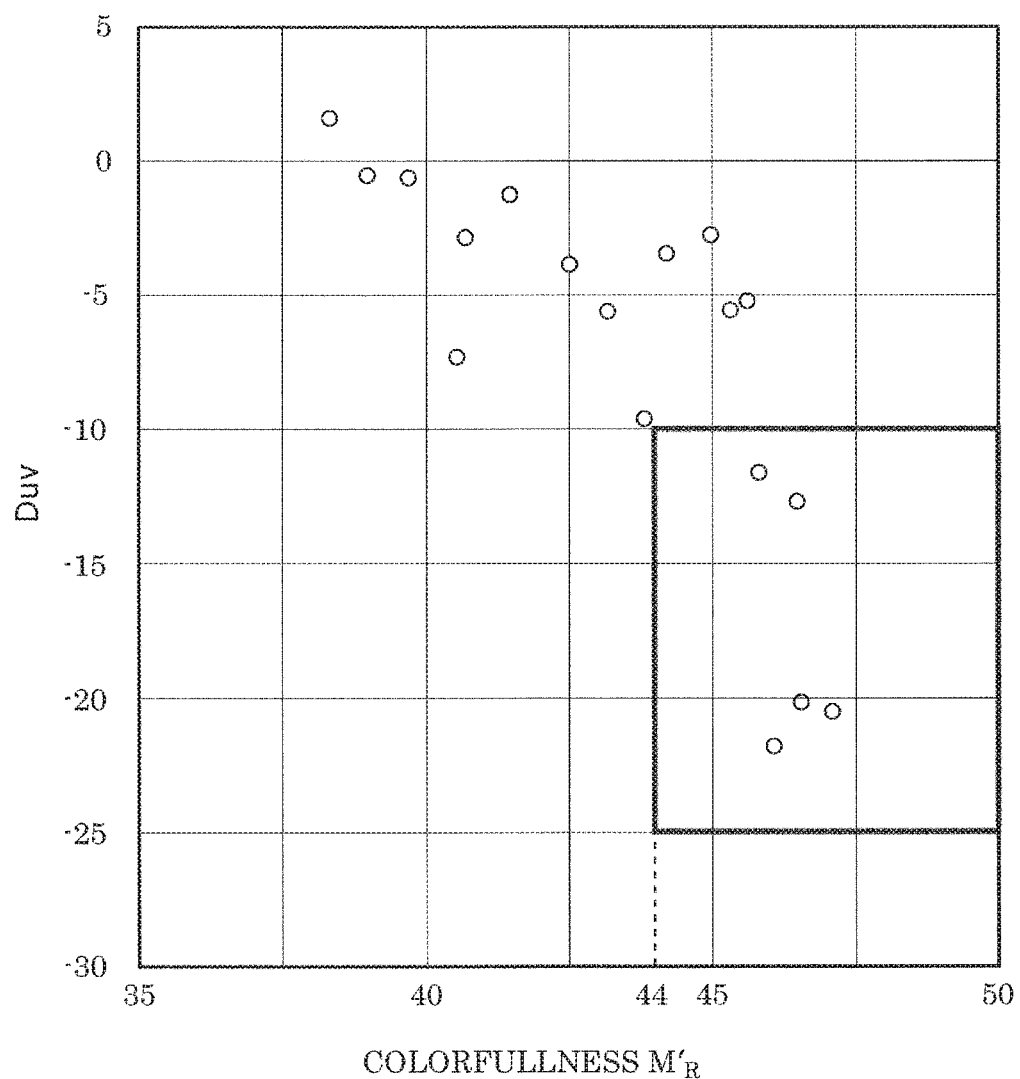
FIG. 8 is a graph for describing parameters which realize a desirable red color appearance.

Here, by taking advantage of the fact that fine adjustment of redness is easy, the inventors have found parameters for light-emitting device 10 which further improve the appearance of red color. Such parameters are described below. FIG. 8 is a graph for describing parameters which realize a desirable red color appearance.

The vertical axis in FIG. 8 represents color deviation Duv. Color deviation Duv is a value indicating the amount of deviation from the black body locus of light chromaticity, and is defined in JISZ8725: 1999. Duv=1000 duv. When color deviation Duv is negative, light color has a reddish tinge.

The horizontal axis in FIG. 8 represents colorfulness $M'_R$. Colorfulness $M'_R$ is a value indicating the appearance of red color when the color sample (hereafter also referred to as red color chart) of special color rendering index R9 is irradiated with light, and is calculated using the color appearance model CIECAM02 described in Cheng Li, M. Ronnier Luo, Changjun Li and Guihua Cui, The CRI-CAM02UCS Colour Rendering Index, COLOR research and application, Volume 37, issue 3, p. 160-167, June 2012 (Non-Patent Literature 1), which is hereby incorporated by reference thereto.

Figure 9:
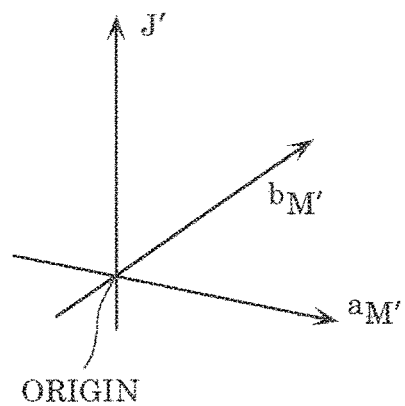
FIG. 9 is a schematic diagram illustrating CAM02-UCS.

CIECAM02 is a model for predicting color appearance from parameters such as tristimulus values and observation conditions. In CIECAM02, colorfulness $M'_R$ is the distance, from the origin, of the red color chart chromaticity in CAM02-UCS (uniform color space), and such a distance from the origin is determined based on the numerical value such as the aforementioned tristimulus values and observation conditions, etc. FIG. 9 is a schematic diagram illustrating CAM02-UCS. In FIG. 9, J' represents brightness (brightness of color, whiteness or blackness), $a_{M'}$ represents the red-green direction hue, and $b_{M'}$ represents the yellow-blue direction hue.

For colorfulness $M'_R$, a larger value indicates darker color and a more vivid appearance. It should be noted that, more specifically, colorfulness $M'_R$ in this written description is calculated assuming typical observation conditions equivalent to 1000lx. Other parameters used in calculating colorfulness $M'_R$ are the values indicated below. It should be noted that in calculating colorfulness $M'_R$, a 10-degree visual field color matching function is used.

$L_A$ (adaptation luminance)=63.66 cd/m²
Yb (relative luminance of background)=20
F (factor determining degree of adaptation)=1.0
c (impact of surrounding)=0.69
Nc (chromatic induction factor)=1.0

It should be noted that details of the colorfulness $M'_R$ calculation method using parameters such as those described above are described in Non-Patent Literature 1. The details of the colorfulness calculation will now be described, as discussed in Non-Patent Literature 1. and thus detailed description will be omitted here.

In this discussion, the colorfulness $M'_R$ noted above is denoted as colorfulness M' for the sake of simplicity. Colorfulness M' is defined by this equation $$M' = 43.86 \ln(1 + 0.0228 M),$$

where M is defined by $$M = C \cdot F_L^{0.25}.$$

In turn, $F_L$ is defined as follows:

$$F_L = 0.2 \cdot k^4 \cdot (5 \cdot L_A) + 0.1 \cdot (1 - k^4)^2 \cdot (5 \cdot L_A)^{1/3}, \text{ where } k = \frac{1}{5 \cdot L_A + 1}.$$

In these equations, $L_A$ is set to 63.66 cd/m².

Turning to the other variable in the equation for M, the chroma C is defined to be:

$$C = t^{0.9} \cdot \left(\frac{J}{100}\right)^{0.5} \cdot (1.64 - 0.29^n)^{0.73}, \text{ where }$$

$$n = \frac{Y_b}{Y_w}.$$

In the equation for n, $Y_b$ is set to 20.

In the equation for chroma C, J and t are defined as follows:

$$t = \frac{\left(\frac{50000}{13} \cdot N_c \cdot N_{cb}\right) \cdot e_t \cdot (a^2 + b^2)^{1/2}}{R'_a + G'_a + \left(\frac{21}{20}\right) \cdot B'_a} \text{ and } J = 100 \cdot \left(\frac{A}{A_w}\right)^{c \cdot z}.$$

As can be seen, J is defined in terms of c, z, Aw, and A. In turn, these terms are defined as follows.

$$z = 1.48 + \sqrt{n},$$

$$A_w = \left[2 \cdot R'_{aw} + G'_{aw} + \frac{B'_{aw}}{20} - 0.305\right] \cdot N_{bb} \text{ and}$$

$$A = \left[2 \cdot R'_a + G'_a + \frac{B'_a}{20} - 0.305\right] \cdot N_{bb}.$$

In addition, in the equation for J, the term c is set to 0.69.

Turning to the terms in the equation for A, it is seen that A is defined in terms of $R'_a$, $G'_a$, and $B'_a$, and $N_{bb}$. $R'_a$ is defined as follows:

$$R'_a = 400 \cdot \left(\frac{\left(\frac{F_L \cdot R'}{100}\right)^{0.42}}{\left(\frac{F_L \cdot R'}{100}\right)^{0.42} + 27.13}\right) + 0.1.$$

And $G'_a$ and $B'_a$ are defined in a similar manner to $R'_a$. As to $N_{bb}$, this term is defined as follows:

$$N_{bb} = 0.725 \cdot \left(\frac{1}{n}\right)^{0.2}, \text{ where } n = \frac{Y_b}{Y_w}.$$

The terms that define $A_w$ are $R'_{aw}$, $G'_{aw}$, $B'_{aw}$, and $N_{bb}$, which was already defined. $R'_{aw}$, $G'_{aw}$, and $B'_{aw}$, are defined by these equations:

$$R'_{aw} = 400 \cdot \left(\frac{\left(\frac{F_L \cdot R'_w}{100}\right)^{0.42}}{\left(\frac{F_L \cdot R'_w}{100}\right)^{0.42} + 27.13}\right) + 0.1$$

$$G'_{aw} = 400 \cdot \left(\frac{\left(\frac{F_L \cdot G'_w}{100}\right)^{0.42}}{\left(\frac{F_L \cdot G'_w}{100}\right)^{0.42} + 27.13}\right) + 0.1$$

$$B'_{aw} = 400 \cdot \left(\frac{\left(\frac{F_L \cdot B'_w}{100}\right)^{0.42}}{\left(\frac{F_L \cdot B'_w}{100}\right)^{0.42} + 27.13}\right) + 0.1$$

Turning to the equation for t, it can be seen from this equation that t depends on $N_c$, $N_{cb}$, $e_t$, a, b, $R'_a$, $G'_a$, and $B'_a$. But $R'_a$, $G'_a$ and $B'_a$ have already been discussed and defined above. As to $N_{cb}$, this term is defined as $N_{cb} = N_{bb}$, which has already been defined.

And terms a and b are defined as:

$$a = R'_a - \frac{12 \cdot G'_a}{11} + \frac{B'_a}{11} \text{ and } b = \frac{(R'_a + G'_a - 2 \cdot B'_a)}{9},$$

where $R'_a$, $G'_a$ and $B'_a$ have already been defined.

As for the surround parameter $N_c$, $N_c$ is set to 1.0 in the equation for t. And as for term $e_t$ in the equation for t, this term $e_t$ is:

$$e_t = \frac{1}{4} \cdot \left[\cos\left(\frac{h' \cdot \pi}{180} + 2\right) + 3.8\right].$$

In turn, h'=h (the hue angle)+360, if h<h1, otherwise h'=h, where $$h = \tan^{-1}\left(\frac{b}{a}\right),$$

and a proper i is chosen (i=1, 2, 3, or 4) so that $h_i \leq h' < h_{i+1}$, using the unique data in Table BII, as follows.

TABLE BII

Unique hue data for calculation of hue quadrature.

| | Red | Yellow | Greed | Blue | Red |
|---|---|---|---|---|---|
| i | 1 | 2 | 3 | 4 | 5 |
| $h_i$ | 20.14 | 90.00 | 164.25 | 237.53 | 380.14 |
| $e_i$ | 0.8 | 0.7 | 1.0 | 1.2 | 0.8 |
| $H_i$ | 0.0 | 100.0 | 200.0 | 300.0 | 400.0. |

The points plotted in FIG. 8 indicate light-emitting devices, the positions of the points are different depending on the color deviation Duv of the white light emitted by the light-emitting device and the colorfulness $M'_R$ that can be obtained by irradiating the red color chart with the white light. The inventors performed an objective evaluation of the white light emitted by the light-emitting devices corresponding to the plotted points and the color appearance when the red color chart is irradiated with the white light.

The white light emitted by light-emitting devices which have a color deviation Duv larger than −10 seem to lack redness. Furthermore, although points are not plotted in FIG. 8, the white light emitted by light-emitting devices having a color deviation Duv smaller than −25 has overly strong redness. Furthermore, the color appearance when the red color chart is irradiated with the white light of light-emitting devices having a colorfulness $M'_R$ that is less than or equal to 44 seem unsatisfactory.

Based on the above, it is preferable that, for the white light emitted by light-emitting device 10, color temperature be at least 2,000 K and at most 3,500 K, color deviation Duv be smaller than −10 and larger than −25. Furthermore, it is preferable that colorfulness $M'_R$ be larger than 44 and smaller than 50. At this time, the color temperature (correlated color temperature) of the white light emitted by light-emitting device 10 is, for example, at least 2,000 K and at most 3,500 K. As described above, such light-emitting device 10 can be realized by adjusting the amount of red phosphor 14r that is added to sealer 13.

It should be noted that, in order to satisfy such conditions, in the light emission spectrum of the white light emitted by light-emitting device 10, the light emission intensity (L2 in FIG. 5) at a 680 nm wavelength may be at least 10% of the light emission intensity (L1 in FIG. 5) at the light emission peak wavelength of red LED chips 12r. In other words, L2/L1 may be at least 0.1. It should be noted that the upper-limit value of L2/L1 is, for example, 0.3.

Modification

Figure 10:
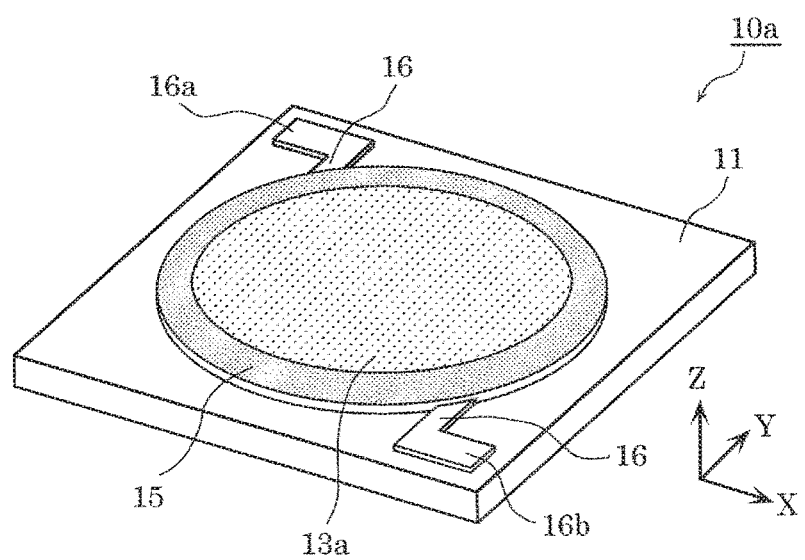
FIG. 10 is an external perspective view of a light-emitting device according to a modification of Embodiment 1.

Light-emitting device 10 described in Embodiment 1 is one example, and the light-emitting device according to the present disclosure is not limited to a form such as that of light-emitting device 10. For example, although sealer 13 seals the plurality of LED chips in lines, on a light-emitting element array basis, sealer 13 may collectively seal all the LED chips provided on board 11. FIG. 10 is an external perspective view of a light-emitting device in which all the LED chips provided on board 11 are collectively sealed. It should be noted that in the description of the modification below, description shall focus on the points of difference from Embodiment 1, and detailed description of elements that have already been described may be omitted.

Light-emitting device 10a illustrated in FIG. 10 includes sealer 13a which is shaped differently from sealer 13. Furthermore, light-emitting device 10a includes dam 15.

Sealer 13a collectively seals all the LED chips provided on board 11. Aside from its shape, sealer 13a is identical to sealer 13, and is formed by adding yellow phosphor 14y and red phosphor 14r in a light-transmissive resin.

Dam 15 is a component that holds back sealer 13a. For dam 15, for example, a thermosetting resin or thermoplastic resin which has an insulating property is used. More specifically, silicone resin, phenol resin, epoxy resin, BT resin, or PPA, etc. is used for dam 15.

In order to enhance the light-extraction efficiency of light-emitting device 10a, light Dam 15 may be photoreflective. In view of this, a white-colored resin (what is called white resin) is used for dam 15. It should be noted that, in order to enhance the photoreflectivity of dam 15, particles of $TiO_2$, $Al_2O_3$, $ZrO_2$, MgO, etc., may be included in dam 15.

In light-emitting device 10a, dam 15 is formed in an annular shape to surround the plurality of LEDs from the side. In addition, sealer 13a is formed in a circular shape in the region surrounded by dam 15. Dam 15 surrounds the plurality of LEDs and sealer 13a from the side. With this, the light-extraction efficiency of light-emitting device 10a can be enhanced.

Furthermore, when sealing the plurality of LEDs included in light-emitting device 10a, it is sufficient to pour sealer 13a into the region surrounded by dam 15, and thus there is the advantage that fabrication equipment can be simplified compared to that in light-emitting device 10 in which sealing is carried out in the shape of lines.

Advantageous Effects, Etc.

As described above, light-emitting device 10 includes blue LED chips 12b having a light emission peak wavelength of at least 430 nm and at most 470 nm and red LED chips 12r having a light emission peak wavelength of at least 600 nm and at most 640 nm. Blue LED chips 12b are examples of a first light-emitting element, and red LED chips 12r are examples of a second light-emitting element.

Furthermore, light-emitting device 10 includes yellow phosphor 14y which, when excited by the light emitted by blue LED chips 12b, emits light having a light emission peak wavelength of at least 500 nm and at most 580 nm, and red phosphor 14r which, when excited by the light emitted by blue LED chips 12b, emits light having a light emission peak wavelength of at least 640 nm and at most 670 nm. Yellow phosphor 14y is an example of a first phosphor, and red phosphor 14r is an example of a second phosphor.

Light-emitting device 10 emits white light through the mixing of the light emitted by each of blue LED chips 12b, red LED chips 12r, yellow phosphor 14y, and red phosphor 14r.

In this manner, because light-emitting device 10 includes both red LED chips 12r and red phosphor 14r, red color reproducibility can be improved. Furthermore, adjustment of redness of light-emitting device 10 becomes easy.

Furthermore, red phosphor 14r may be a phosphor comprising a nitride. Specifically, red phosphor 14r is a $CaAlSiN_3:Eu^{2+}$ phosphor or a $(Sr, Ca)AlSiN_3:Eu^{2+}$ phosphor, etc.

Accordingly, because of the phosphor comprising a nitride, the red color reproducibility of light-emitting device 10 can be improved.

Furthermore, the white light may have a color temperature of at least 2,000 K and at most 3,500 K, a color deviation Duv smaller than −10 and larger than −25. Colorfulness, which indicates the appearance of red color when the color sample of special color rendering index R9 is irradiated with the white light, may be larger than 44 and smaller than 50.

Accordingly, light-emitting device 10 having further improved red color appearance is realized.

Furthermore, in the light emission spectrum of the white light, the light emission intensity at a 680 nm wavelength may be at least 10% of the light emission intensity at the light emission peak wavelength of red LED chips 12r.

Accordingly, light-emitting device 10 having further improved red color appearance is realized.

Furthermore, blue LED chips 12b and red LED chips 12r may be connected in series.

With this, red color reproducibility can be improved.

Furthermore, blue LED chips 12b and red LED chips 12r may be collectively sealed by sealer 13 which contains yellow phosphor 14y and red phosphor 14r. Sealer 13 is an example of a light-transmissive resin.

Accordingly, light-emitting device 10 in which blue LED chips 12b and red LED chips 12r are sealed by sealer 13 containing yellow phosphor 14y and red phosphor 14r is realized.

It should be noted that although the configuration of light-emitting device 10 is described mainly in Embodiment 1, the same configuration as in light-emitting device 10 can also be applied to light-emitting device 10a.

Embodiment 2

Figure 11:
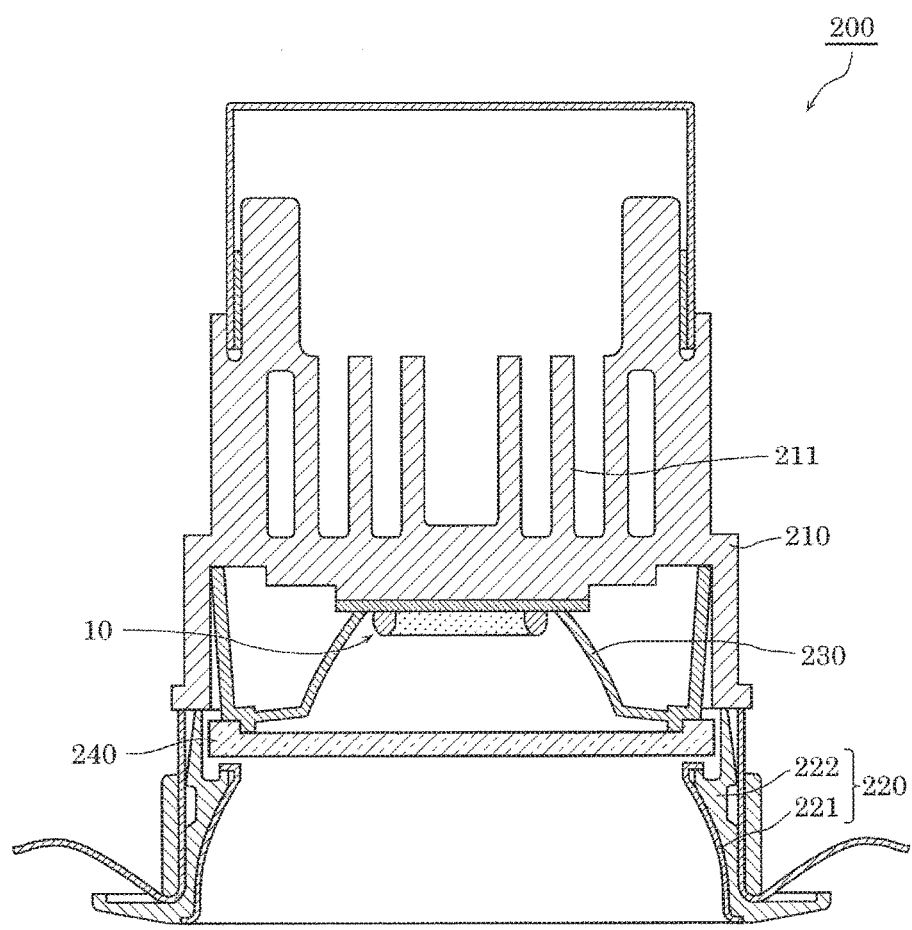
FIG. 11 is a cross-sectional view of an illuminating apparatus according to Embodiment 2.
Figure 12:
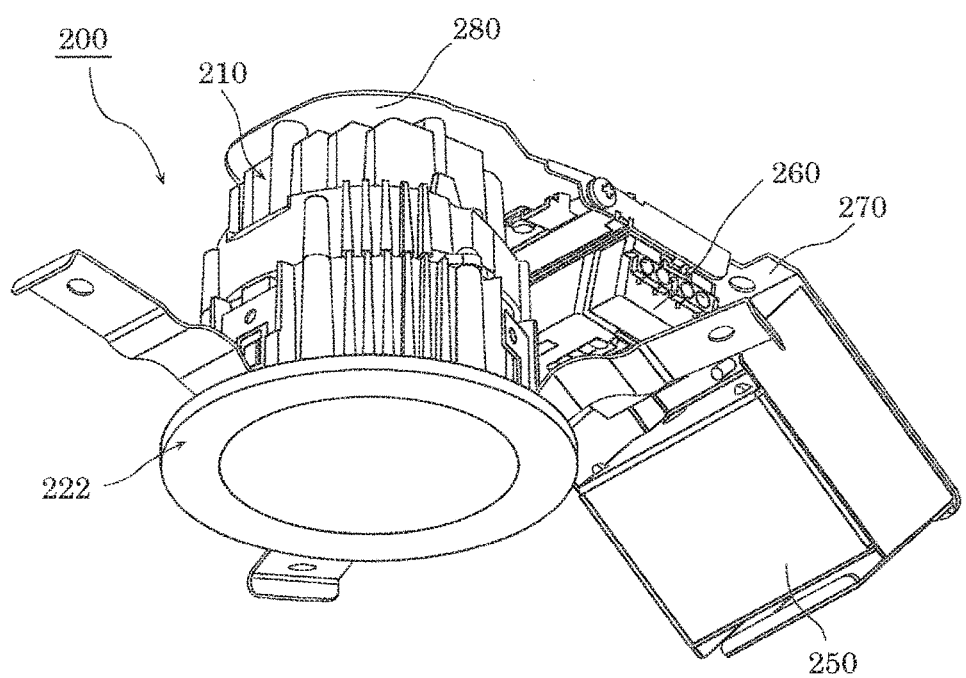
FIG. 12 is an external perspective view of the illuminating apparatus according to Embodiment 2 and peripheral components thereof.

First, illuminating apparatus 200 according to Embodiment 2 will be described using FIG. 11 and FIG. 12. FIG. 11 is a cross-sectional view of illuminating apparatus 200 according to Embodiment 2. FIG. 12 is an external perspective view of illuminating apparatus 200 according to Embodiment 2 and peripheral components thereof.

As illustrated in FIG. 11 and FIG. 12, illuminating apparatus 200 according to Embodiment 1 is a recessed illuminating apparatus such as a downlight that is set by being recessed into the ceiling of a house, for example, and emits light downward (illuminates a corridor, a wall, etc.).

Illuminating apparatus 200 includes light-emitting device 10. Illuminating apparatus 200 further includes: a substantially cylindrical, bottomed apparatus body configured by joining base 210 and frame 220; and reflector 230 and light-transmissive panel 240 which are disposed in the apparatus body.

Base 210 is an attachment base to which light-emitting device 10 is attached, and is a heat sink that dissipates the heat generated by light-emitting device 10. Base 210 is formed in a substantially columnar shape using a metal material, and comprises die-cast aluminum in Embodiment 2.

Plural heat-dissipating fins 211 projecting upward are provided on the top portion (ceiling-side portion) of base 210, at regular intervals along one direction. With this, the heat generated by light-emitting device 10 can be efficiently dissipated.

Frame 220 includes cone 221 which is substantially cylindrical and has a reflecting face in an inner surface, and frame body 222 to which cone 221 is attached. Cone 221 is formed using a metal material, and can be fabricated, for example, by drawing or press-forming an aluminum alloy, etc. Frame body 222 is formed using a rigid resin material or a metal material. Frame 220 is fixed by attaching frame body 222 to base 210.

Reflector 230 is annular frame-shaped (funnel-shaped) reflecting component, the inner surface of which having a reflecting function. Reflector 230 can be formed using a metal material such as aluminum. It should be noted that reflector 130 may be formed using a rigid white resin material instead of a metal material.

Light-transmissive panel 240 is a light-transmissive component having a light-diffusing property and a light-transmissive property. Light-transmissive panel 240 is a flat plate disposed between reflector 230 and frame 220, and is attached to reflector 230. Light-transmissive panel 240 can be formed in the shape of a disc using a transparent resin material such as acrylic, polycarbonate, etc.

It should be noted that illuminating apparatus 200 need not include light-transmissive panel 240. By not including light-transmissive panel 240, the luminous flux of the light emitted from illuminating apparatus 200 can be improved.

Furthermore, as illustrated in FIG. 12, in illuminating apparatus 200, lighting device 250 and terminal base 260 are connected to light-emitting device 10. Lighting device 250 supplies power for causing light-emitting device 10 to light up; and terminal base 160 relays alternating current power from a commercial power supply to lighting device 250. Specifically, lighting device 250 converts the alternating current power relayed from terminal base 260 into direct current power, and outputs the direct current power to light-emitting device 10.

Lighting device 250 and terminal base 260 are fixed to attaching board 270 which is provided separately from the apparatus body. Attaching board 270 is formed by bending a rectangular board-like component comprising a metal material. Lighting device 250 is fixed to the bottom surface of one end portion in the longitudinal direction of attaching board 270, and terminal base 260 is fixed to the bottom surface of the other end portion in the longitudinal direction of attaching board 270. Attaching board 270 and top board 280, which is fixed to the top portion of base 210 of the apparatus body, are linked to each other.

As described above, illuminating apparatus 200 includes light-emitting device 10 and lighting device 250 which supplies light-emitting device 10 with power for causing light-emitting device 10 to light-up. With this, illuminating apparatus 200 can improve red color reproducibility.

It should be noted that illuminating apparatus 200 may include light-emitting device 10a in place of light-emitting device 10. In this case too, illuminating apparatus 200 can improve red color reproducibility.

It should be noted that although a downlight is given as an example of an illuminating apparatus in Embodiment 2, the illuminating apparatus according to the present disclosure may be realized as another illuminating apparatus such as a spotlight, etc.

Other Embodiments

Although a light-emitting device and an illuminating apparatus according to exemplary embodiments have been described thus far, the present disclosure is not limited to the foregoing embodiments.

For example, although a light-emitting device having a COB structure is described in the foregoing embodiments, the present disclosure can also be applied to a light-emitting device having a surface mount device (SMD) structure. An SMD light-emitting device (light-emitting element) includes, for example, a resin container having a concave portion, an LED chip mounted inside the concave portion, and a sealer (phosphor-containing resin) filling the inside of the concave portion.

Furthermore, in the foregoing embodiments, an LED chip mounted on the board is chip-to-chip connected to another LED chip using a bonding wire. However, an LED chip may be connected by a bonding wire to wiring (metal film) provided on the board, and electrically connected to another LED chip via the wiring.

Furthermore, in the foregoing embodiment, an LED chip is given as an example of a light-emitting element used in the light-emitting device. However, a semiconductor light-emitting element such as a semiconductor laser or a solid-state light-emitting element such as an organic electroluminescent (EL) element or an inorganic EL element may be employed as a light-emitting element.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting device comprising:
   a first light-emitting element having a light emission peak wavelength of at least 430 nm and at most 470 nm;
   a second light-emitting element having a light emission peak wavelength of at least 600 nm and at most 640 nm;
   a first phosphor which, when excited by light emitted by the first light-emitting element, emits light having a light emission peak wavelength of at least 500 nm and at most 580 nm; and
   a second phosphor which, when excited by light emitted by the first light-emitting element, emits light having a light emission peak wavelength of at least 640 nm and at most 670 nm,
   wherein the light-emitting device emits white light through mixing of light emitted by each of the first light-emitting element, the second light-emitting element, the first phosphor, and the second phosphor,
   wherein the white light has a color temperature of at least 2,000 K and at most 3,500 K, and a color deviation Duv smaller than −10 and larger than −25, and
   wherein a colorfulness is larger than 44 and smaller than 50, in which the colorfulness indicates an appearance of red color when a color sample of a special color rendering index R9 is irradiated with the white light.

2. The light-emitting device according to claim 1, wherein the second phosphor comprises a nitride.

3. The light-emitting device according to claim 1, wherein, in a light emission spectrum of the white light, light emission intensity at a 680 nm wavelength is at least 10 percent of a light emission intensity at the light emission peak wavelength of the second light-emitting element.

4. The light-emitting device according to claim 1, wherein the first light-emitting element and the second light-emitting element are connected in series.

5. The light-emitting device according to claim 1, wherein the first light-emitting element and the second light-emitting element are collectively sealed by a light-transmissive resin containing the first phosphor and the second phosphor.

6. The light-emitting device according to claim 1, further comprising
   a substrate to which the first light-emitting element and the second light-emitting element are directly mounted.

7. The light-emitting device according to claim 6,
   wherein the substrate has an optical reflectance of at least 90%, and
   wherein the light emitted by the first light-emitting element and the second light-emitting element is reflected off of a surface of the substrate.

8. The light-emitting device according to claim 6,
   wherein the substrate comprises a light-transmissive ceramic.

9. A light-emitting device comprising:
   a plurality of light-emitting arrays comprising a plurality of first light-emitting elements each having a light emission peak wavelength of at least 430 nm and at most 470 nm, and a plurality of second light-emitting elements each having a light emission peak wavelength of at least 500 nm and at most 580 nm;
   a first phosphor which, when excited by light emitted by the plurality of first light-emitting elements, emits light having a light emission peak wavelength of at least 500 nm and at most 580 nm; and
   a second phosphor which, when excited by light emitted by the plurality of first light-emitting elements, emits light having a light emission peak wavelength of at least 640 nm and at most 670 nm,
   wherein the light-emitting device emits white light through mixing of light emitted by each of the plurality of first light-emitting elements, the plurality of second light-emitting elements, the first phosphor, and the second phosphor,
   wherein the white light has a color temperature of at least 2,000 K and at most 3,500 K, and a color deviation Duv smaller than −10 and larger than −25, and
   wherein a colorfulness is larger than 44 and smaller than 50, in which the colorfulness indicates an appearance of red color when a color sample of special color rendering index R9 is irradiated with the white light.

10. The light-emitting device according to claim 9,
    wherein the plurality of light-emitting arrays are connected in parallel, and
    wherein the plurality of first light-emitting elements and the plurality of second light-emitting elements are connected in series.

11. The light-emitting device according to claim 9,
    wherein at least one light-emitting array of the plurality of light-emitting arrays includes at least one light-emitting element of the plurality of first light-emitting elements and at least one light-emitting element of the plurality of second light-emitting elements, the at least one light-emitting element of the plurality of first light-emitting elements and the at least one light-emitting element of the plurality of second light-emitting elements being connected in series.

12. The light-emitting device according to claim 9,
    wherein two light-emitting arrays of the plurality of light-emitting arrays comprise an equal number of light-emitting elements of the plurality of first light-emitting elements and light-emitting elements of the plurality of second light-emitting elements.

13. The light-emitting device according to claim 9,
    wherein one light-emitting array of the plurality of light-emitting arrays comprises twice as many light-emitting elements of the plurality of first light-emitting elements than light-emitting elements of the plurality of second light-emitting elements.

14. The light-emitting device according to claim 9, wherein only light-emitting elements of the plurality of first light-emitting elements are adjacent light-emitting elements of the plurality of second light-emitting elements.

15. The light-emitting device according to claim 9, wherein the plurality of first light-emitting elements and the plurality of second light-emitting elements are collectively sealed by light-transmissive resin containing the first phosphor and the second phosphor.

16. The light-emitting device according to claim 9, wherein, in a light emission spectrum of the white light, light emission intensity at a 680 nm wavelength is at least 10 percent of a light emission intensity at the light emission peak wavelength of the plurality of second light-emitting elements.

17. An illuminating apparatus comprising:
the light-emitting device according to claim 1; and
a lighting device which supplies the light-emitting device with power for causing the light-emitting device to light up.

* * * * *